(12) United States Patent
Safieh, Jr.

(10) Patent No.: US 7,535,131 B1
(45) Date of Patent: May 19, 2009

(54) SMART SWITCH

(76) Inventor: William A. Safieh, Jr., 3950 W. Redfield Rd., Phoenix, AZ (US) 85053

( * ) Notice: Subject to any disclaimer, the term of this patent is extended or adjusted under 35 U.S.C. 154(b) by 163 days.

(21) Appl. No.: 11/613,555

(22) Filed: Dec. 20, 2006

Related U.S. Application Data

(60) Provisional application No. 60/752,164, filed on Dec. 20, 2005.

(51) Int. Cl.
*G06F 13/40* (2006.01)
(52) U.S. Cl. .................. 307/134; 307/116; 307/141.4
(58) Field of Classification Search .............. 307/141.4, 307/116, 139, 141.14, 134; 200/43.01
See application file for complete search history.

(56) References Cited

U.S. PATENT DOCUMENTS

2005/0068712 A1* 3/2005 Schulz et al. ............... 361/287

* cited by examiner

*Primary Examiner*—Albert W Paladini
*Assistant Examiner*—Carlos Amaya
(74) *Attorney, Agent, or Firm*—Parsons & Goltry; Robert A. Parsons; Michael W. Goltry

(57) ABSTRACT

A universal switch interface includes a monitored switch having an ON mode and an OFF mode of operation and connected circuitry. The circuitry includes a rising edge sensor coupled to the monitored switch to provide a first timing signal indicative of a rising edge when the monitored switch is moved from one mode to the other and a falling edge sensor coupled to the monitored signal to provide a second timing signal indicative of a falling edge when the monitored switch is moved from into the opposite mode. A counter is coupled to start with the first timing signal and to stop with the second timing signal. The counter is designed to provide an output signal from the monitored switch only when the second timing signal occurs a predetermined period of time after the first timing signal.

15 Claims, 3 Drawing Sheets

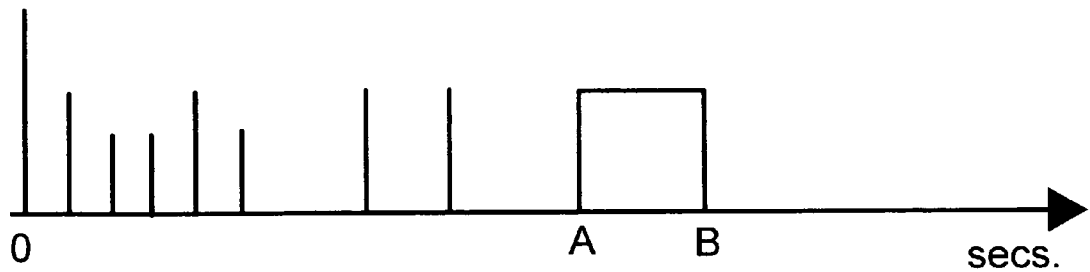
FIGURE 1
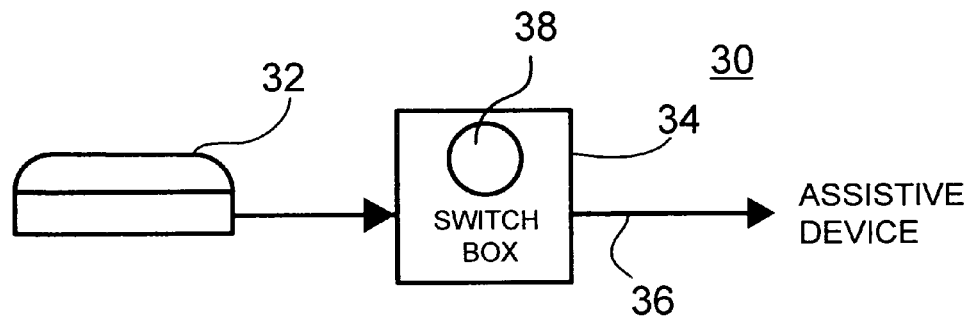
FIGURE 5
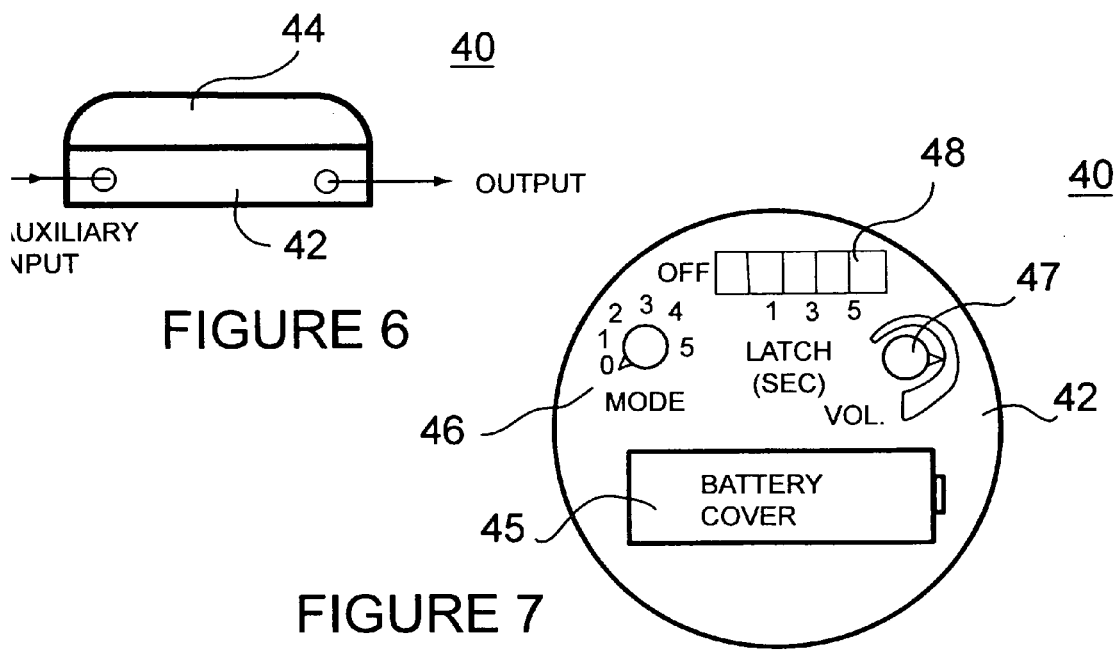
FIGURE 6
FIGURE 7

SMART SWITCH

CROSS-REFERENCE TO RELATED APPLICATIONS

This application claims the benefit of U.S. Provisional Application No. 60/752,164, filed 20 Dec. 2005.

FIELD OF THE INVENTION

This invention relates in general to switches for activating various devices and more particularly to switches that operate only under predetermined conditions.

BACKGROUND OF THE INVENTION

Under many circumstances, switches that are used to control various devices can be very difficult to operate. For example, people with hand tremors and the like might strike a push-button switch a number of times in a second while intending to simply close or open the switch once. Further, people with handicaps, such as paralysis requiring a switch to be operated by the head, might have difficulty making positive contact every time. Also, toys and other devices for children or sensors used to monitor the disposition of children, patients, etc. might include switches other than push-button switches (e.g. pressure sensors, contact switches, etc.). All such switches are referred to herein generically as push-button switches. Other difficulties, such as switch bounce, can occur because of unintentional multiple operations of the switch. Latching, on the other hand, enables a latched period of time for a given input stimulus. When all of these features are combined, the result is a universal switch interface that can accommodate for many difficulties in the industry.

It would be highly advantageous, therefore, to remedy the foregoing and other deficiencies inherent in the prior art.

Accordingly, it is an object of the present invention to provide a new and improved smart switch.

Another object of the invention is to provide a new and improved smart switch that may be used to control apparatus for handicapped and/or elderly people, patients in care giving facilities, children, children's toys, and the like.

Another object of the invention is to provide a new and improved smart switch that forms a universal switch interface that can accommodate for many difficulties in the industry.

SUMMARY OF THE INVENTION

The above objects and others are realized in a universal switch interface including a monitored switch with an ON mode and an OFF mode of operation and circuitry coupled to the monitored switch to provide an output signal from the monitored switch only after the monitored switch is operated between modes for a predetermined period of time.

The above objects and others are further realized in a specific embodiment of a universal switch interface that includes a monitored switch having an ON mode and an OFF mode of operation and connected circuitry. The circuitry includes a rising edge sensor coupled to the monitored switch to provide a first timing signal indicative of a rising edge when the monitored switch is moved from one mode to the other and a falling edge sensor coupled to the monitored signal to provide a second timing signal indicative of a falling edge when the monitored switch is moved from into the opposite mode. A counter is coupled to start with the first timing signal and to stop with the second timing signal. The counter is designed to provide an output signal from the monitored switch only when the second timing signal occurs a predetermined period of time after the first timing signal.

The above objects and others are further realized in a method of monitoring a switch and providing an output from the switch including the steps of providing a monitored switch having an ON mode and an OFF mode of operation, sensing a rising edge when the monitored switch is moved from one of the ON mode and the OFF mode to the other of the ON mode and the OFF mode, providing a predetermined time period and starting the predetermined time period when the rising edge is sensed, sensing a falling edge when the monitored switch is moved from one of the OFF mode and the ON mode to the other of the OFF mode and the ON mode after the predetermined period of time has passed, stopping the predetermined time period when the falling edge is sensed, and providing an output signal from the monitored switch only when the falling edge occurs within a selected time after passage of the predetermined period of time.

BRIEF DESCRIPTION OF THE DRAWINGS

The foregoing and further and more specific objects and advantages of the invention will become readily apparent to those skilled in the art from the following detailed description taken in conjunction with the drawings in which:

FIG. 1 graphically illustrates switch input signals including the problem and a solution in accordance with the present invention;

FIG. 5 is a simplified block diagram of an embodiment of a smart switch in accordance with the present invention;

FIGS. 6 and 7 are side and bottom views, respectively, of another embodiment of a smart switch in accordance with the present invention;

DETAILED DESCRIPTION OF THE DRAWINGS

Figure 3:
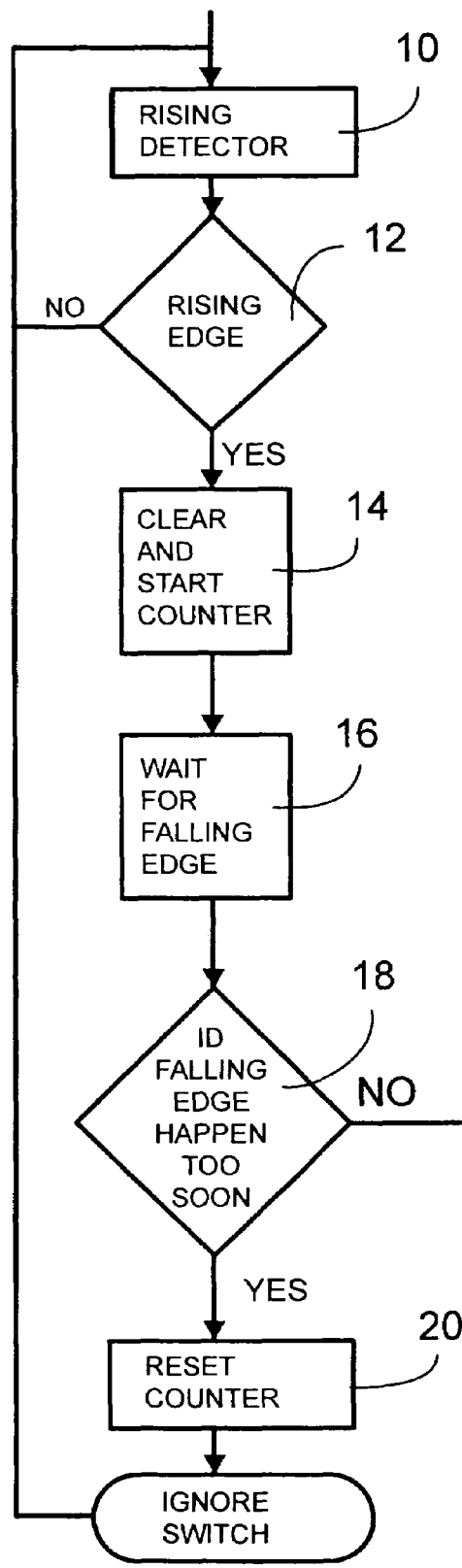
FIGS. 3, a), b), and c), is a graphical representation of some sample valid and invalid signals in accordance with the logic filtering diagram of FIG. 2.
Figure 3:
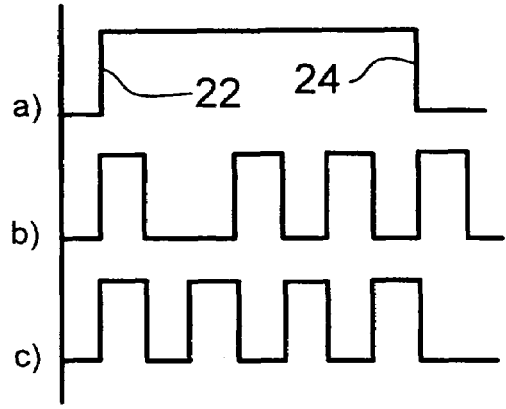

Turning to the drawings, in which like reference characters indicate corresponding elements throughout the several views, attention is first directed to FIG. 1, which graphically illustrates the problem and one possible solution. The graph of FIG. 1 illustrates a typical example of hand tremors in which a push-button switch that the user is attempting to activate has been unintentionally pushed seven times. If the switch that the user is attempting to operate is a standard push-button switch, the switch will remain inactive after the seven operations.

In normal instances, hand tremors can be anywhere in a range between 4 and 25 Hz, or 4-25 tremors per second. To overcome the multiple operations of a switch that these tremors could cause, the switch is controlled to operate only after the push-button is depressed for a predetermined period of time. As illustrated in FIG. 1, the time between points A and B on the graph indicate the adjustable time required for the push-button switch to be depressed before it will be actuated, whereby the multiple switch impulses are translated into a single pulse bounded by the a to b timeline, ultimately removing the bounce.

In one embodiment of the invention, circuitry associated with the switch includes adjustable elements that allow the period of time required for the switch to operate to be selected preferably in increments (e.g. 0.1 sec.) anywhere from 0-5 seconds. Typically, logic circuits and a clock or time generator can be used as the associated circuitry or a simple microprocessor can be used. Here it should be understood that the circuitry could be digital or analog, chiefly because of the relatively low frequencies involved. Some debounce options that can be incorporated or substituted are HW filters (to remove voltage spikes), simple low pass filters to filter transients, and/or a Schmidt trigger (E.g. 74 HCT 19) or equivalents.

Figure 2:
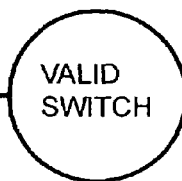
FIG. 2 is a logic filtering diagram.

Referring to the logic filtering diagram of FIG. 2, when the push button switch is depressed a signal is applied to rising edge detector 10. Decision block 12 decides if the signal supplied is a rising edge or not. If not, the apparatus goes back to the wait mode until another signal is applied to rising edge detector 10. If the received signal is a rising edge, a counter is cleared and started, as indicated in block 14. The counter continues to run until a falling edge is detected, as indicated by block 16. Using the count generated by the counter in connection with block 14 and the falling edge signal generated in block 16, a decision block 18 determines if the falling edge occurred too soon. If not, the circuitry determines that it is a valid signal and the switch is actuated. If the falling edge occurs too soon, a signal is supplied to a reset counter at block 20 and the switch operation is ignored, with the circuitry returning to the standby or wait mode of operation until the next signal is detected in rising edge detector 10.

Here it will be understood that a "push button" switch is used for purposes of explanation but the switch being monitored could be any type of switch having two modes of operation generally referred to herein as an ON mode and an OFF mode of operation. For example, the switch could be a push button switch, a pressure transducer, a "joystick", touch or capacitive sensors, rotation sensor, force transducer, etc. all of which are generally included in the term "monitored switch". Also the definitions of "rising" and "falling" edges are generally determined by the components of the system and the type of switch being monitored. As is understood in the art, each definition involves a percentage of the change between minimum (herein generically referred to as the "OFF mode") and maximum (herein generically referred to as the "ON mode") and the normal time required to change from minimum to maximum for the type of switch being monitored.

Referring additionally to FIG. 3, waveform a) illustrates a valid signal in which a rising edge 22 and a falling edge 24 are spaced apart a sufficient distance or time to operate the switch. Waveform b) illustrates an invalid signal or operation in which the rising edge and falling edge are not spaced a sufficient distance or time apart. Waveform c) illustrates a typical hand tremor in which the rising edge and falling edge are spaced a sufficient distance or time apart. It will of course be understood that rising and falling edges could be reversed in some types of switches and in various applications.

Figure 4:
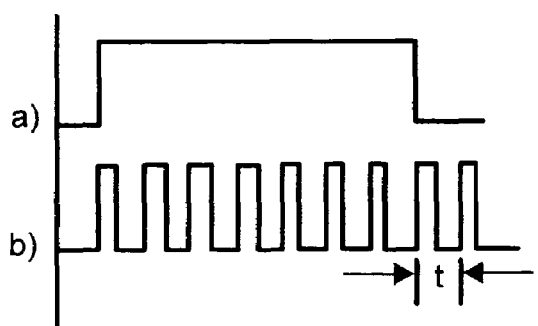
FIGS. 4, a) and b), illustrate a typical timing diagram for the logic filtering diagram of FIG. 2.

Referring additionally to FIG. 4 a typical timing diagram is illustrated with a selected operating time illustrated in FIG. 4a and counter signals or pulses illustrated in FIG. 4b. Generally, a predetermined number of counter signals or pulses (FIG. 4b), referred to hereinafter as a predetermined period of time, is selected by the operator, as explained in more detail below. The detected rising edge starts the counter. The detected falling edge must appear after the predetermined number of pulses, or time, occurs. In the above example, if the detected falling edge is not encountered by the time the counter exceeds time t, i.e. the time from the start of one pulse until the start of the next pulse, then a signal is supplied to reset the counter and the switch operation is ignored. In the example illustrated in FIG. 4b, eight pulses from the counter must occur before a falling edge is sensed and the falling edge must occur between the start of the eighth pulse and the start of the ninth pulse. If the detected falling edge is encountered by the time the counter exceeds time t, then the output goes low completing a pulse waveform that follows the input signal envelope.

Turning now to FIG. 5, a simplified block diagram is shown of a smart switch 30 in accordance with the present invention. Smart switch 30 includes a typical push-button switch 32 with an output connected to a switch box 34. In this embodiment, switch box 34 includes any associated circuitry used to determine when push-button switch 32 is properly operated and provides an activated switch signal at an output 36, which can be coupled, for example, to some type of assistive device that the user is attempting to activate. Switch box 34 can also include a speaker 38 that provides a tone or other signal indicating whether an activation signal has been generated or not for positive or negative reinforcement.

Turning now to FIGS. 6 and 7, side and bottom views are illustrated, respectively of another embodiment of a smart switch, designated 40, in accordance with the present invention. In this embodiment, smart switch 40 includes a base 42 with a depressible diaphragm or cover 44. The bottom view of base 42, in FIG. 7, illustrates a concave or depressed area that includes a battery receiving opening, covered by a battery cover 45, for providing power to smart switch 40. Also included is a mode switch 46 with a plurality of modes (in this embodiment 0-5) or settings. Mode switch 46, for example, can be used to select an operating time (referring to the above description) or a specific filter if low frequency or low pass filters are used to detect hand tremors or to select different modes of operation. The low frequency structure is described in more detail below. A volume control 47 is provided if a speaker is associated with smart switch 40. An indicator 48 provides a visual indication of the mode of operation, including whether the power to smart switch 40 is on or off.

Figure 8:
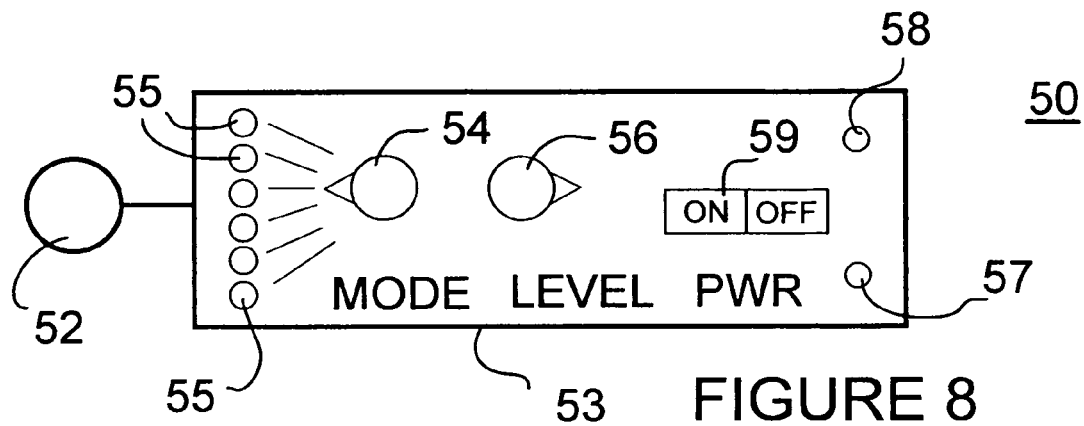
FIG. 8 is a top view of another embodiment of a smart switch in accordance with the present invention.

Turning now to FIG. 8, another embodiment of a smart switch, designated 50, is illustrated in accordance with the present invention. Smart switch 50 includes a push-button switch 52 coupled to switch circuitry 53. Switch circuitry 53 includes a mode selector switch 54 with an LED (light emitting diode) associated with each position. The LED associated with each position is lighted when mode selector switch 54 is in that position. A level control 56 provides a level or amplitude signal to a speaker or other indicator that may be included in switch circuitry 53 or may be in additional circuitry attached to an output terminal 57. Also included is a power terminal 58 adapted to be connected to an external power source and a power switch 59.

Figure 9:
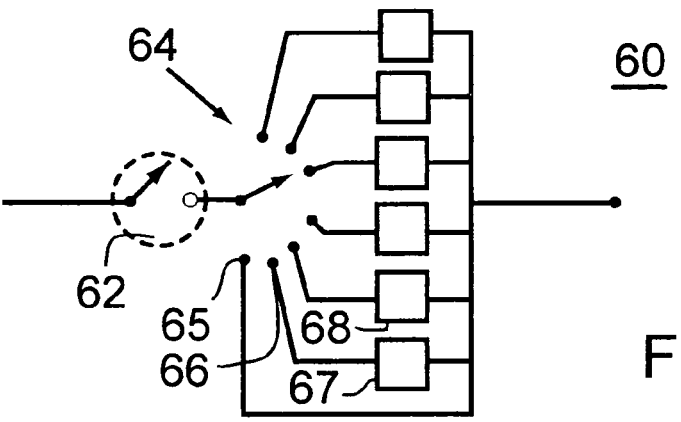
FIG. 9 is a simplified schematic of a smart switch, such as that illustrated in FIG. 7 or 8.

Referring additionally to FIG. 9, a simplified schematic is illustrated of associated circuitry 60 for a smart switch, such as smart switch 40 or 50 illustrated in FIG. 7 or 8, respectively. Circuitry 60 includes a push-button switch 62 connected to a mode selector 64. In this example, mode selector 64 has seven positions with a first position 65 connected directly to an output (i.e. no delay or filtering), a second position 66 connected through a low pass filter 67, a third position connected through a low pass filter 68, and each succeeding position connected through a different low pass filter. As an example, low pass filter 67 could be designed to pass 5 Hz or lower, the next low pass filter 68 could be designed to pass 10 Hz or lower, and so on through the six filters. While low pass filters are discussed herein, it will be understood by those skilled in the art that a variety of different filters could be used if desired or convenient.

Figure 10:
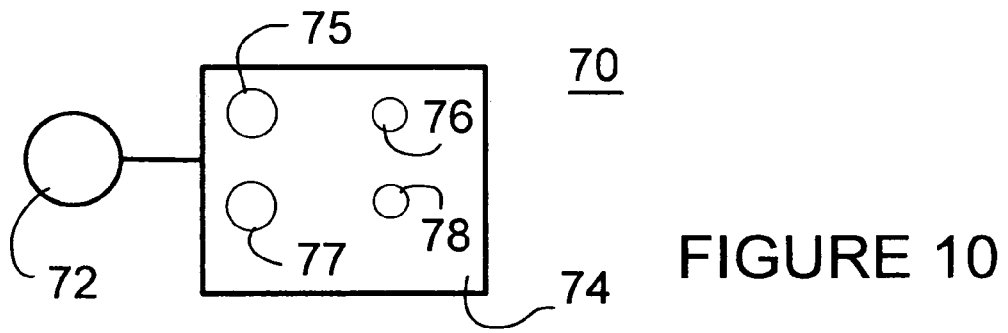
FIGS. 10 and 11 are top views of other embodiments of a smart switch in accordance with the present invention.

Referring to FIG. 10, a smart switch 70 is illustrated. Smart switch 70 includes a push-button switch 72 and associated circuitry 74. In this embodiment, circuitry 74 includes a position scanning switch 75 with an associated LED 76 and a selector switch 77 with an associated LED 78. In a typical example of the operation of circuitry 74, when position scanning switch 75 is operated LED 76 turns red or is simply activated to indicate the scanning or setting mode and LED 78 will blink at a one Hertz frequency to indicate the set mode of circuitry 74. Selector switch 77 may then be operated to select a desired mode by, for example, depressing it once for mode 1, depressing it twice for mode 2, etc. Generally, if position scanning switch 75 is operated and for some reason no further action is taken (e.g. selector switch 77 is not operated), circuitry 74 will simply return to the normal operating mode.

Figure 11:
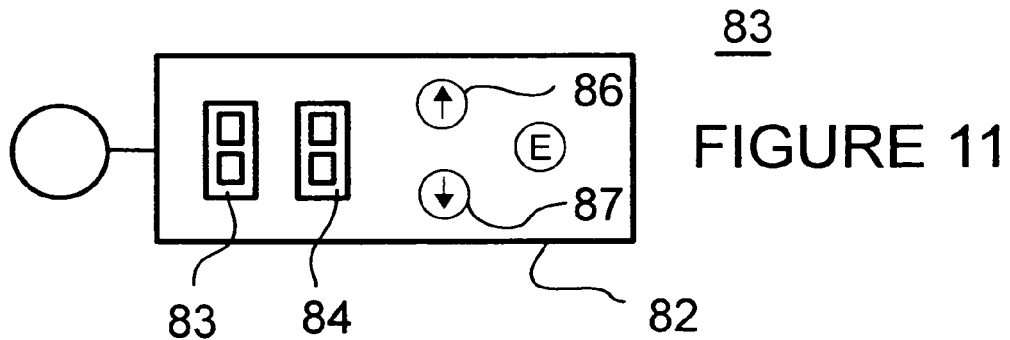

Referring to FIG. 11, another embodiment of a smart switch, generally designated 80, in accordance with the present invention is illustrated. In this embodiment, associated circuitry is included in a housing, generally designated 82, with two numeric displays 83 and 84, which may be any of the well known liquid crystal or LED displays currently used in industry, positioned on the upper surface. As is understood in the art, each display 83 and 84 can be activated to represent any number from zero to nine and can also display some letters. In this example, display 83 is used to display a level and may display the letter L during rest to indicate that it represents a level. In very simple cases, the letter L or the word level can simply be placed on the surface of housing 82 adjacent to display 83. Similarly, display 84 displays a setting, which may be designated in a similar fashion.

Also included on the upper surface of housing 82 are an up switch 86 and a down switch 87. Up switch 86 can be used to increase the number of either display 83 or display 84. Down switch 87 can be used to decrease the number of either display 83 or display 84. In this embodiment, an enter switch, designated E, is used (for example depressed for an extended period) to select which display is being set and may, for example, be depressed again to enter the setting or level finally selected.

In a preferred example of operation, the enter switch is depressed for 3 seconds and level display 83 flashes at a 2 Hz rate. If the L is incorporated into display 83, rather than appearing on the surface of housing 82, the L will flash to indicate that the level is being set. The up or down buttons 86 or 87 are used to select the desired level. The enter button is then depressed to stop level display 83 from flashing and to enter the selected level into the system. Depressing the enter button for another 3 second period will cause display 84 to begin flashing at a 2 Hz rate. Again, if the S is incorporated into display 84, rather than appearing on the surface of housing 82, the S will flash to indicate that the level is being set. The up or down buttons 86 or 87 are used to select the desired setting. The enter button is then depressed to stop level display 84 from flashing and to enter the selected setting into the system.

It will be understood that many different types of situations and applications will result in different interfaces and displays. Therefore each of the different embodiments disclosed above may have different and/or alternative applications. Since it is anticipated that the smart switch may be used to control apparatus for handicapped and/or elderly people, patients in care giving facilities, children, children's toys, and the like, the interface should be selected to best facilitate the user or the person setting the switch.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A universal switch interface comprising:
   a monitored switch having an ON mode and an OFF mode of operation;
   circuitry coupled to the monitored switch to provide an output signal from the monitored switch only after the monitored switch is operated between modes for a predetermined period of time, the circuitry includes a counter connected to be activated by a first movement of the monitored switch into one of the On mode and the OFF mode and to be deactivated after a later movement, at least equal to the predetermined period of time, of the monitored switch into another of the OFF mode and the ON mode, and a rising edge sensor and a falling edge sensor connected to the counter to activate and deactivate the counter, respectively.

2. A universal switch interface as claimed in claim 1 wherein the predetermined period of time is adjustable.

3. A universal switch interface as claimed in claim 2 wherein the predetermined period of time is adjustable from approximately 0 sec. to 5 sec.

4. A universal switch interface as claimed in claim 3 wherein the predetermined period of time is adjustable from approximately 0 sec. to 5 sec. in 0.1 sec. increments.

5. A universal switch interface as claimed in claim 1 wherein the circuitry is designed to start the counter with a signal from the rising edge sensor, the predetermined period of time is determined by a number of counts from the counter, and a signal from the falling edge sensor stops the counter when it occurs after the number of counts and before an additional count beyond the number of counts.

6. A universal switch interface as claimed in claim 1 wherein the monitored switch includes one of a push button switch, a pressure transducer, a "joystick", and a touch or capacitive sensor.

7. A universal switch interface as claimed in claim 1 wherein the circuitry includes one of digital and analog circuits.

8. A universal switch interface comprising:
   a monitored switch having an ON mode and an OFF mode of operation;
   a rising edge sensor coupled to the monitored switch to provide a first timing signal indicative of a rising edge when the monitored switch is moved from one of the ON mode and the OFF mode to the other of the ON mode and the OFF mode;
   a falling edge sensor coupled to the monitored signal to provide a second timing signal indicative of a falling edge when the monitored switch is moved from one of the OFF mode and the ON mode to the other of the OFF mode and the ON mode; and
   a counter, the first timing signal being coupled to the counter to start the counter and the second timing signal being coupled to the counter to stop the counter, the counter being designed to provide an output signal from the monitored switch only when the second timing signal occurs a predetermined period of time after the first timing signal.

9. A universal switch interface as claimed in claim 8 wherein the predetermined period of time is adjustable.

10. A universal switch interface as claimed in claim 9 wherein the predetermined period of time is adjustable from approximately 0 sec. to 5 sec.

11. A universal switch interface as claimed in claim 10 wherein the predetermined period of time is adjustable from approximately 0 sec. to 5 sec. in 0.1 sec. increments.

12. A universal switch interface as claimed in claim 8 wherein the predetermined period of time is determined by a number of counts from the counter, and the second timing signal stops the counter and the counter provides an output signal from the monitored switch only when the second timing signal occurs after the number of counts and before an additional count beyond the number of counts.

13. A method of monitoring a switch and providing an output from the switch comprising the steps of:

providing a monitored switch having an ON mode and an OFF mode of operation;

sensing a rising edge when the monitored switch is moved from one of the ON mode and the OFF mode to the other of the ON mode and the OFF mode;

providing a predetermined time period and starting the predetermined time period when the rising edge is sensed;

sensing a falling edge when the monitored switch is moved from one of the OFF mode and the ON mode to the other of the OFF mode and the ON mode after the predetermined period of time has passed;

stopping the predetermined time period when the falling edge is sensed; and providing an output signal from the monitored switch only when the falling edge occurs within a selected time after passage of the predetermined period of time.

14. A method as claimed in claim 13 wherein the step of providing a predetermined time period includes providing a counter with a number of counts representing the predetermined time period.

15. A method as claimed in claim 14 wherein the step of providing an output signal from the monitored switch includes providing an output signal only when the falling edge occurs after the number of counts and before an additional count beyond the number of counts.

* * * * *